(12) United States Patent
Niedermeier et al.

(10) Patent No.: US 7,359,232 B2
(45) Date of Patent: Apr. 15, 2008

(54) MULTI-CONTEXT MEMORY CELL

(75) Inventors: Thomas Niedermeier, Rosenheim (DE); Tim Schoenauer, Feldkirchen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/427,336

(22) Filed: Jun. 28, 2006

(65) Prior Publication Data

US 2007/0002606 A1    Jan. 4, 2007

(30) Foreign Application Priority Data

Jun. 28, 2005   (DE) .................... 10 2005 030 140

(51) Int. Cl.
*G11C 7/00* (2006.01)
(52) U.S. Cl. .................................. 365/154; 365/185.04
(58) Field of Classification Search ................ 365/154, 365/185.04
See application file for complete search history.

(56) References Cited

U.S. PATENT DOCUMENTS

| | | | |
|---|---|---|---|
| 5,473,571 A | | 12/1995 | Shigematsu et al. |
| 5,523,772 A | * | 6/1996 | Lee ............................ 345/98 |
| 6,008,821 A | * | 12/1999 | Bright et al. ............... 345/504 |
| 6,480,954 B2 | | 11/2002 | Trimberger et al. |
| 6,493,272 B1 | * | 12/2002 | Fujii et al. ............. 365/189.05 |
| 2003/0188241 A1 | | 10/2003 | Zyuban et al. |
| 2004/0051574 A1 | | 3/2004 | Ko et al. |
| 2004/0141363 A1 | | 7/2004 | Ohtsuka et al. |

OTHER PUBLICATIONS

F. Bedeschi et al., "4-Mb MOSFET-Selected Phase-Change Memory Experimental Chip", Proceeding of the 30th European Solid-State Circuits Conference, 2004. ESSCIRC 2004, Sep. 21-23, 2004, pp. 207-210.

S. Trimberger, D. Carberry, A. Johnson and J. Wong, "A Time-Multiplexed FPGA", Proceedings of the 5th Annual IEEE Symposium on FPGAs for Custom Computing Machines, Apr. 16-18, 1997, pp. 22-28.

S. Shigematsu, S. Mutoh, Y. Matsuya, Y. Tanabe and J. Yamada, "A 1-V High-Speed MTCMOS Circuit Scheme For Power-Down Application Circuits", IEEE Journal of Solid-State Circuits, vol. 32, Issue: 6, pp. 861-869, Jun. 1997.

* cited by examiner

*Primary Examiner*—Michael T Tran
(74) *Attorney, Agent, or Firm*—Patterson & Sheridan, L.L.P.

(57) ABSTRACT

The multi-context memory cell comprises a first memory means for storing an item of data information and also a plurality of second memory means, it being possible for the data information stored in the first memory means to be saved in each second memory means. Moreover, the memory cell comprises a means for saving the data information stored in the first memory means into one of the second memory means, and also a means for storing the digital data information stored in a selected second memory means into the first memory means.

14 Claims, 9 Drawing Sheets

MULTI-CONTEXT MEMORY CELL

CROSS-REFERENCE TO RELATED APPLICATIONS

This application claims foreign priority benefits under 35 U.S.C. §119 to co-pending German patent application number 10 2005 030 140.1, filed Jun. 28, 2005. This related patent application is herein incorporated by reference in its entirety.

BACKGROUND OF THE INVENTION

1. Field of the Invention

One embodiment of the invention relates to a multi-context memory cell having a first memory means and a plurality of second memory means, it being possible for the digital data information stored in the first memory means to be saved in each of the second memory means. The multi-context memory cell may be used for storing an item of binary data information. Moreover, embodiments of the invention relate to a multibit multi-context memory cell comprising a plurality of binary multi-context memory cells mentioned above. Furthermore, embodiments of the invention are directed at a memory block comprising a plurality of multibit multi-context memory cells of this type.

2. Description of the Related Art

A context describes the way in which a specific hardware circuit is utilized. In modern processor architectures, the efficient processing of different parallel contexts is assuming an ever weightier significance. Two different types of contexts can be differentiated:

a) Configuration Context

The so-called configuration context specifies how a flexible hardware circuit is instantaneously configured. Examples of a configuration context are the programming of a processor or the bit sequence for the configuration of an FPGA (field programmable gate array).

b) Execution Context

In some cases, the execution context, by contrast, may be understood as the instantaneous state of specific memory cells or of each memory cell of a specific hardware circuit. Examples of an execution context may include the values of counters, data registers or status registers.

In some data processing concepts in which the same hardware circuit is used differently at different times, it may be useful for an active context to be replaced more or less frequently by a different context, the deactivated context being stored for reactivation. This operation is also referred to as a context switch. Examples of data processing concepts based on parallel contexts are multitasking (concurrence of a plurality of processes), multithreading (concurrence of a plurality of processing threads within a process), hardware reprogramming and hardware reconfiguration. In some cases, to provide a maximum efficiency, the outlay for a context switch may be as small as possible. In this connection, outlay may be understood to be the additional chip area used for storage and for switching of contexts or the time delay associated with the context switch.

Thus, in so-called multi-context processors (multiple context processors), a single processor may be used for a plurality of quasi-parallel processing threads, each processing thread being assigned to a context. One advantage of such processors may be that a waiting time which occurs in the case of a specific context (for example for reading out data from an external memory) is bridged with data processing steps of a different context that is activated in the meantime.

Two processor data paths are illustrated by way of example in FIG. 1. The left-hand data path involves an arithmetic unit with two data inputs in0 and in1 and a data output out. This data path comprises a plurality of D-type flip-flops FF and multiplexers MUX and also an arithmetic logic unit ALU/MULT for carrying out multiplications or additions. The right-hand data path is extended in comparison with the left-hand data path in such a way that it supports a plurality of contexts. For this purpose, three flip-flops FF are provided per context, said flip-flops being represented in the same plane in FIG. 1. The respectively active context is selected by means of the context switch signal sel, which in each case selects three flip-flops FF of a plane. The multiplexers typically used for selection in the data path at the inputs and outputs of the flip-flops FF are not illustrated in FIG. 1.

For processing a plurality of contexts, three different approaches are known in principle in the prior art:

1. Storing a Deactivated Context in a Buffer Memory and Reading It in Again from Said Buffer Memory One concept of the first approach is for a deactivated context to be stored in a buffer memory and to be retrieved from said buffer memory when being used. Such an approach is often used for processing execution contexts in computers. In one embodiment, when a task switch takes place in such a system, by way of example, the data content either of, for example, all the context registers or only of those context registers which are of importance for the subsequent task may be saved in the main memory of the system. A plurality of clock cycles may be used for saving the context information from the context registers and for storing the context information into the context registers since these steps are typically carried out sequentially for the affected context registers.

In a similar manner, in cache memories, a cache line provided for exchange is saved in the main memory. In this case, too, a plurality of clock cycles may be used for saving the cache line and possibly for restoring a saved cache line.

A further example for this approach relates to the configuration memory of an FPGA. Such a configuration memory is loaded sequentially with a bit sequence from an additional external memory, the external memory typically being a non-volatile memory, for example PROM (programmable read-only memory), ROM (read-only memory) or flash memory. In this case, different configurations can be stored as configuration contexts in the external memory and be read into the FPGA when being used. In a modern FPGA, it is also possible only selectively for part of the configuration memory to be occupied by new configuration information. In contrast to execution contexts, the configuration context currently stored in the configuration memory does not have to be saved before a different configuration context is read in from the external memory.

2. Switch Between Individual Context Memory Modules

In this approach, each context is allocated a dedicated context memory module, for example in the form of a set of register cells or SRAM (static random access memory). In this case, the respective memory module is selected by means of a suitable selection means, typically by means of a multiplexer which receives the outputs of the individual memory modules. A typical field of application for this solution is multithreading, each processing thread being allocated to a context.

This approach is distinguished by a high processing speed, that is to say that ideally a context switch can be carried out without any delay or with a delay merely of one clock cycle. In some cases, it may be disadvantageous, by contrast, for the memory modules to be embodied identically and thus provide the same circuitry outlay. The greater the complexity with which even only a single memory module may be embodied, for example because a plurality of inputs and/or outputs may be used, the greater, too, may be the implementation outlay for the rest of the memory modules. Moreover, the selection means is situated in the access path, as a result of which the timing for the memory access may be adversely influenced.

If the number of contexts to be supported is greater than the number of available memory modules, the approach described under point 1. may additionally be employed.

3. Selection of Different Segments in a Single Context Memory Module

This third concept known from the prior art uses only a single large context memory module in which a plurality of contexts are stored. Specific bits of the address word applied to the memory module in this case serve as a pointer which points to the respective memory segment allocated to a context. The respective segment address is generated by means of a modulo n up and down counter in this case, thus resulting in a ring memory structure. What may be disadvantageous about this solution is that the entire memory module, as described in a similar manner under point 2. may have the same complexity (for example with regard to the number of inputs and outputs). Moreover, in comparison with a plurality of smaller memory modules, a large memory module may be more sluggish in terms of access (for example, on account of the more complex addressing). If the number of contexts to be supported is greater than the storage capacity of the memory module, the approach described under point 1. may additionally be pursued.

Further, highly specialized solutions for the processing of contexts are known in addition to the three basic approaches described above. Thus, the document "A time-multiplexed FPGA", Trimberger, S. et al., 5th IEEE Symposium on FPGA-Based Custom Computing Machines (FCCM '97), page 22 et seq., and the document U.S. Pat. No. 6,480,954 B2 disclose providing a plurality of configuration contexts in an FPGA. Mutually corresponding bits of different configuration contexts are read into a corresponding number of SRAM cells in this case, an SRAM cell being allocated to each configuration context per configuration bit. By means of select lines, a specific SRAM cell is selected for each configuration bit depending on the configuration context chosen and is read out via a common bit line into a flip-flop. The current configuration bit can be retrieved via the flip-flop.

As the number of power-loss-sensitive applications of monolithic integrated circuits increases, for example, in the area of mobile applications, and as the power loss consumption rises on account of increasing complexity of these circuits, it is expedient to operate temporarily unused circuit blocks with a reduced power loss in a so-called power-down mode, or even to shut them down completely.

For some applications it is advantageous if the memory cells used for data storage, for example, in sequential circuits, save their storage state upon transition from the normal operating mode to the power-down mode, so that the respective circuit block may have the same state as previously again after the transition from the power-down mode to the normal operating mode and the restoring of the saved storage states.

What may be disadvantageous about the three basic approaches for context processing as described above is that none of these approaches already inherently enables the storage state to be saved and retained during operation in the power-down mode. In the case of the first approach (see point 1), this function could be provided by using a non-volatile memory, for example flash memory, instead of a volatile DRAM (dynamic random access memory) for the buffer memory, but this equates to an additional outlay.

The typical cases of application and also the possible advantages and disadvantages of the three basic approaches described above are summarized again in the table below:

TABLE 1

Comparison of known context switch concepts

| Approach | Typical application | Advantages | Disadvantages |
| --- | --- | --- | --- |
| Use of a buffer memory (see point 1) | Multitasking Cache | Low implementation outlay Possibility of realizing the saving of the storage state in the power-down mode with a non-volatile buffer memory | A plurality of clock cycles may be used for saving and restoring |
| Switch between individual memory modules (see point 2) | Multithreading | Fast context switch | Outlay rises linearly with the number of contexts Selection means in the access path Saving of the storage state in the power-down mode may not be supported |
| Use of a single memory module (see point 3) | Multitasking Ring memory | Fast context switch | Outlay rises linearly with the number of contexts Slow memory access Saving of the storage state in the power-down mode may not be supported |

For the purpose of saving the storage state of a circuit block in the power-down mode, it is known from the prior art to use so-called retention memory cells which are in each case provided not only with volatile memory means but also with an additional memory means for saving and retention of the storage state during operation in the power-down mode. If the memory cells are latches or flip-flips with bistable multivibrators for volatile data storage, the term used is retention latches or retention flip-flops.

In the implementation of such retention flip-flops or retention latches (only one multivibrator), two types of retention flip-flops or retention latches are known in principle in the prior art: firstly memory cells which are implemented purely using CMOS technology (complementary metal oxide semiconductor) and secondly memory cells which are based on a combination of CMOS technology and non-volatile memory technology.

If the retention flip-flops or retention latches are realized purely using CMOS technology, a second supply voltage is typically provided in addition to the primary supply voltage, and, in contrast to the primary supply voltage, is not switched off during the power-down mode. A retention flip-flop of this type is disclosed in the documents U.S. Pat. No. 5,473,571 and "A 1-V High-speed MTCMOS Circuit Scheme for Power-down Application Circuits", Shigematsu et al., Journal of Solid State Circuits, June 1997, pages 861 to 869. In this case, an additional latch fed by means of the second supply voltage is used to save the storage state of the flip-flop during the power-down mode. If the flip-flop is fed with the primary supply voltage again after the power-down mode, the saved storage state can be restored again into the circuit section of the flip-flop that is operated with the primary supply voltage. A retention flip-flop of this type is often referred to as a balloon flip-flop in the prior art, the latch operated with the second supply voltage being referred to as a balloon latch.

The prior art (thus, by way of example US 2003/0188241 and US 2004/051574) discloses a multiplicity of retention flip-flops which are based on the balloon flip-flop described in the document cited above and have a reduced area usage or a higher data rate.

Retention flip-flops based purely on CMOS technology may, in some cases, have a multiplicity of disadvantages. For example, one property of pure CMOS technology may be the storage volatility thereof. In some cases, it may only be used for volatile data storage. If the supply voltage is switched off, the data content may be lost. For this reason, a second supply voltage may be provided, which remains active in the power-down mode. This may cost additional chip area since the second supply voltage may be distributed on the chip. Moreover, a balloon flip-flop of this type may occupy a larger chip area in comparison with a customary flip-flop without data saving. In some cases, the additional area usage of a flip-flop of this type may correspond to more than 50% of the chip area of a customary flip-flop. Moreover, a leakage current may flow during the power-down mode in the balloon latch, said leakage current being associated with an additional power loss during the power-down mode. In some cases, the leakage current may be reduced by using transistors having a threshold voltage with a large magnitude.

In some cases, the disadvantages mentioned above may be eliminated for the most part by using non-volatile memory technologies in the implementation of a retention flip-flop.

So-called PCM technology (phase change memory) may be suitable for this purpose, this technology being briefly described below. PCM technology is currently the focus of intensive research, for example, in connection with matrix memories. PCM technology makes it possible to program the value of a resistance element, the programming being non-volatile and thus being maintained when the supply voltage is switched off. PCM technology is based on changing the phase state of a chalcogenide glass thermally in a reversible manner between the amorphous state and the polycrystalline state. In this case, the resistivity of a resistance element comprising chalcogenide glass is greater in the amorphous state than in the polycrystalline state. The change in the phase state is brought about by heat generated by means of a current pulse through the resistance element. In this case, the duration and the current intensity of the current pulse determine whether the resistance element subsequently may have a high or low resistance value.

FIG. 2 illustrates two exemplary current pulses 1 and 2 for the programming of a resistance element of this type. The resistance element is converted into the amorphous state with a resistance value of 1 MΩ by means of the current pulse 1 having a relatively high current intensity of 200 μA and a relatively short pulse duration of 20 ns, while the resistance element is transformed into the polycrystalline state with a resistance value of 10 kΩ by means of the current pulse 2 having a relatively low current intensity of 50 μA and a relatively long pulse duration of 50 ns.

One advantage of PCM technology over other non-volatile memory technologies may be that a reduction in the dimensions of the storing elements is advantageous. The smaller the structures used, the lower the used current intensity of the current pulse that initiates the phase change. What is more, PCM resistance elements may be realized in the upper layers of a CMOS semiconductor process so that the resistance elements can be arranged above the transistors, for example in each case directly above the transistors assigned to a memory cell.

The document US 2004/0141363 A1 describes the application of PCM technology in connection with SRAM memory cells. Customary SRAM memory cells in each case comprise a bistable multivibrator in the form of two cross-coupled inverters for volatile information storage, the binary information corresponding to the potential value of the two output nodes of the two inverters. In the case of the SRAM memory cell described in this document, a respective PCM resistance element is additionally connected to each of the two storage nodes via a switchable coupling NMOS transistor. In order to save the binary information stored in the bistable multivibrator, the resistance elements are programmed in a manner dependent on the potential of the storage nodes. The binary information can subsequently be restored from the resistance elements into the bistable multivibrator again.

SUMMARY OF THE INVENTION

Proceeding from circuitry approaches for processing a plurality of contexts that are known from the prior art, embodiments of the invention specify a circuitry concept for processing a plurality of contexts which may provide state saving for the power-down mode without an additional circuitry outlay.

According to one embodiment of the invention, provision is made of a multi-context memory cell comprising a first memory means, for example a bistable multivibrator having two cross-coupled inverters, for storing an item of digital data information. Furthermore, the multi-context memory cell according to one embodiment of the invention comprises n+1 (where n>0) second memory means, it being possible for the digital data information stored in the first memory means to be saved in each of the second memory means. Moreover, the multi-context memory cell according to one embodiment of the invention comprises a means for saving the digital data information stored in the first memory means into one of the second memory means, it being possible selectively to select a specific memory means for saving. Finally, a storing means is provided in the multi-context memory cell, said storing means being configured in such a way that the data information stored in an arbitrarily selected second memory means can be stored into the first memory means.

Accordingly, one concept of embodiments of the invention is that a plurality of second memory means may be provided, for example, instead of a single second memory means for saving the data information as in a retention memory cell (e.g. as in a retention flip-flop), each context being assigned a second memory means. If a saved item of data information is maintained in a second memory means during power-down operation, the second memory means can simultaneously perform two functions: firstly, the second memory means can serve for saving an item of data information from the first memory means during power-down operation of the first memory means; secondly, different contexts may be stored independently of power-down operation in the individual second memory means. A specific context may become the active context by virtue of the corresponding data information from the associated second memory means being stored into the first memory means by means of the means for storing the digital data information.

One possible advantage of the circuit concept described above is that circuit blocks comprising memory cells of this type can be implemented very minimally in respect of outlay with regard to the utilized chip area. For the case where both functionalities, that is to say both the storage of a plurality of contexts and the saving in the power-down mode, are supported in the respective circuit, a significant saving in terms of area may be provided since the second memory means may be used for both functions.

A further chip area reduction of the circuit concept according to one embodiment of the invention in comparison with concepts known from the prior art may be provided when the memory cells have an increased functionality, for example, a plurality of data inputs and/or data outputs. Typically, in the case of the concepts known from the prior art under point 2 and point 3, said increased functionality may be available for each memory cell in the respective context memory module, that is to say that the memory cells may have the same number of inputs and outputs. In one embodiment of the invention, the increased functionality may relate only to the implementation of the first memory means. For example, the latter may have a plurality of inputs and/or outputs. In one embodiment, the second memory means may not have said increased functionality, however.

One possible advantage of embodiments of the invention is that the behavior of the overall circuit comprising the multi-context memory cells according to one embodiment of the invention may be independent of the quantity of data of the stored context. This may be attributed to the second memory means being decoupled sufficiently from the first memory means in the time-critical data path of the circuit block via the saving means and the storing means. Embodiments of the invention may therefore make it possible to store a large quantity of context data without the data path of the circuit block being impaired by a parasitic influence (for example capacitive loads) associated with the storage of the contexts.

Furthermore, one embodiment the invention may not use any multiplexers in the access path as in the solution from the prior art described under point 2. Thus, the timing for the memory access may not be adversely influenced by multiplexers.

Moreover, the circuit block comprising the multi-context memory cells according to one embodiment of the invention can generally be put into the power-down mode immediately without complicated saving operations, since the contexts have been saved in the second memory means anyway.

It is conceivable, in principle, for the digital data information to comprise a plurality of data bits. It is assumed hereinafter in the case of the multi-context memory cell according to one embodiment of the invention, however, that the digital data information is an item of binary data information, that is to say that one bit is stored in the first memory means. In this case, the first memory means may include, for storing the digital data information, at least one bistable multivibrator in the form of two cross-coupled CMOS inverters (it is also possible, of course, to use a plurality of multivibrators as in the case of a master-slave flip-flop).

The second memory means may be non-volatile memory means such as, for example, flash memory, non-volatile RAM, for example, FeRAM (ferroelectric random access memory) or MRAM (magnetoresistive random access memory). In principle, however, it would be conceivable in the sense of the application to implement the second memory means with a volatile memory technology, in for example, purely with a CMOS technology as in the document U.S. Pat. No. 5,473,571.

In this case, it may be advantageous if each second memory means in each case comprises a resistance element, for example, only a single resistance element, the resistance value of which is binary programmable. The digital binary data information stored in the first memory means can thus be saved in a non-volatile manner in the form of the resistance value of the respective resistance element. In this case, each resistance element may be assigned to a context.

The resistance elements may be PCM resistance elements having a larger resistance value in the amorphous state than in the polycrystalline state. However, alternative memory technologies may be used in which, as in PCM technology, the information is stored on the basis of the resistance programming of a resistance element. As an example of an alternative memory technology of this type, reference shall be made here to PMC technology (programmable metallization cell).

The multi-context memory cell according to embodiments of the invention may comprise a respective selection switch, for example, in each case in the form of a MOS transistor, per resistance element, each selection switch being connected in series with in each case another of the resistance elements mentioned above. If a specific switch is switched in low-resistance fashion, a current can flow through the associated resistance element in order to read from or write to the resistance element. With the use of selection switches, the saving and storing means—as will be explained in more detail below—can be embodied in a very simple manner since the actual resistance selection does not have to be effected via the saving or storing means. In this case, the connecting point of the resistance element to which the selection switch is connected may not have an affect.

The first memory means typically comprises one or a plurality of storage nodes, the binary information—as usual in the case of a bistable multivibrator for example—being stored in the form of the potential value of a specific storage node, which is referred to hereinafter as the first storage node.

According to a one embodiment, the means for saving the data information for each resistance element in each case comprises a saving switch, for example, in the form of a MOS transistor, which is arranged between the respective resistance element and the first storage node. Such a switch connects the first storage node to the respective resistance element (closed switch position) or decouples the first storage node from the respective resistance element (opened switch position). In this case, the saving switch, with a closed switch position, serves for programming the respective resistance element in a manner dependent on the potential of the first storage node. With a closed switch position, a current thus flows through the resistance element in the case of one of the two potential states of the first storage node, which current reprograms the resistance element. If the other potential state is present, the resistance element is not reprogrammed. In one embodiment, if no selection switches are provided, each saving switch may be driven by different binary control signals.

In one embodiment, if—as described above—a respective selection switch is provided for each resistance element, it may be possible, as an alternative, to simplify the means for saving the data information in such a way that said means comprises only a single saving switch arranged between, for example, each of the resistance elements and the first storage node. In this case, the programming of a specific resistance element in a manner dependent on the potential of the first node may be provided by a specific resistance element which is selected by means of the selection switches (for example, only one selection switch may be closed) and the saving switch may be, moreover, closed.

If, by contrast, no selection switches are provided in the case of the described embodiment, a specific saving switch may be closed in order to program the respective resistance element, while the remaining saving switches remain open. In this case, a specific resistance element is selected by means of the switch position of the saving switches.

It should be noted that when selection switches are used, a dedicated saving switch may also be assigned to each resistance element, in which case the saving switches are controlled by means of a common binary control signal, in contrast to the approach without selection switches.

The means for storing the binary information may be configured in such a way that it defines the potential value of a second storage node of the first memory means in a manner dependent on the resistance value of a selectable resistance element. In this case, the second storage node may optionally be identical to the first storage node.

In this case, it may be advantageous if the means for storing the binary data information comprises a means for initializing the potential of the second storage node with a fixed value, for example with the ground potential (VSS) or the positive operating voltage potential (VDD). As a result of this, the second storage node can be put into a defined state prior to the actual restoring of the binary information.

Analogously to the embodiment described above for saving the binary data information, according to one embodiment, the means for storing the saved binary data information for each resistance element in each case comprises a storing switch, for example, in the form of a MOS transistor. Each storing switch is arranged between the respective resistance element and the second storage node. Such a storing switch, with a closed switch position, connects the second storage node to the respective resistance element. With an opened switch position, this switch decouples the second storage node from the associated resistance element. If the second switch is closed, the second storage node is subjected to charge reversal in a manner dependent on the previously programmed resistance value. In this case, the binary information is produced on the basis of the potential of the second storage node at the end of the charge-reversal process. In one embodiment, if no selection switches are provided, each of the storing switches may be driven by different binary control signals.

If a respective selection switch is provided for each resistance element, it is possible as an alternative—as in the case of the means for saving the data information—to simplify the means for storing the data information in such a way that the means for storing the saved binary data information comprises a single storing switch, for example, in the form of a MOS transistor, which is arranged between the resistance elements and the second storage node. The restoring of an item of binary data information from a selected resistance element into the first memory means may be provided by a specific resistance element which is selected by means of the selection switches (for example, only one selection switch may be closed) and the storing switch may be, moreover, closed.

If, by contrast, no selection switches are provided in the case of the first advantageous embodiment, a specific storing switch may be closed, while the other storing switches are open. In this case, a specific resistance element may be selected by means of the switch position of the storing switches.

In one embodiment, when selection switches are used, a dedicated storing switch may also be assigned to each resistance element, in which case the storing switches are controlled by means of a common binary control signal, in contrast to the approach without selection switches.

The means for saving the data information may include, according to a first embodiment, for each resistance element in each case an initialization switch, for example, in the form of a MOS transistor. By means of an initialization switch, the associated resistance element is initialized to a specific value of the two programmable values. The initialization switches are arranged between the respective resistance element and a node having a fixed potential. Each initialization switch, with a closed switch position, connects the assigned resistance element to the node having a fixed potential, for example to VSS, and, with a closed switch position, decouples the respective resistance element from the node having a fixed potential. If the respective initialization switch is closed for a certain duration, a current pulse flows through the assigned resistance element, which current pulse initializes the resistance element with a defined resistance value. In one embodiment, if no selection switches are provided, each of the initialization switches may be driven by different binary control signals.

If a respective selection switch is provided for each resistance element, it is possible—as described above in connection with the saving and storing switches—alternatively to simplify the means for saving the data information in such a way that the means for saving the data information comprises only one initialization switch arranged between the resistance elements and a node having a fixed potential. In this case, a specific resistance element may be initialized by closing the initialization switch and the associated selection switch and while the other selection switches simultaneously remain open.

When selection switches are used, each resistance element may also be assigned a dedicated initialization switch, in which case the initialization switches are controlled by means of a common binary control signal, in contrast to the approach without selection switches.

The multi-context memory cell may be configured in such a way that the digital data information stored in the first memory means can be saved in a selected second memory means, while an item of digital data information from a selected second memory means can be stored into the first memory means. If, in this case, the first memory means is a master-slave flip-flop having a master stage (master latch) and a slave stage (slave latch), the multi-context memory cell may be configured in such a way that the saving of the data information from the slave latch (alternatively: master latch) into a selected second memory means may be effected at the same time as the storage of an item of digital data information from another second memory means into the master latch (alternatively: slave latch). This may be provided, for example, by virtue of the first storage node connected to the saving switch(es) being part of the slave multivibrator (alternatively: master multivibrator). In this case, the second storage node connected to the storing switch(es) is part of the master multivibrator (alternatively: slave multivibrator).

In order to achieve the formulated object, a multibit multi-context memory cell, which comprises N+1 (where N>0) above-described multi-context memory cells according to one embodiment of the invention for storing an item of binary data information. The individual multi-context memory cells are connected virtually in parallel in this case, so that N+1 bits can be stored and processed in parallel. In this case, the N+1 first memory means from the different multi-context memory cells respectively form a first multibit memory means. In a corresponding manner, N+1 second memory means from different multi-context memory cells respectively form one of a total of n+1 second multibit memory means. In this case, the digital multibit data information stored in the first multibit memory means can be saved in each of the second multibit memory means. The saving of the multibit data information from the first multibit memory means into a selected second multibit memory means is effected by the N+1 individual saving means. Analogously, the storage of an item of multibit data information from a selected second multibit memory means into the first multibit memory means is effected by the N+1 individual storing means.

Furthermore, the formulated object can also be achieved by means of a memory block in one embodiment, which comprises a plurality of identical multibit multi-context memory cells. Said memory block has an N+1 bit wide data bus and also an address input. A specific multibit multi-context memory cell can be selected via the address input. The selected multibit multi-context memory cell is then connected to the data bus.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. The invention is explained in more detail below on the basis of a plurality of exemplary embodiments with reference to the drawings, in which.

DETAILED DESCRIPTION OF THE PREFERRED EMBODIMENT

Figure 3:
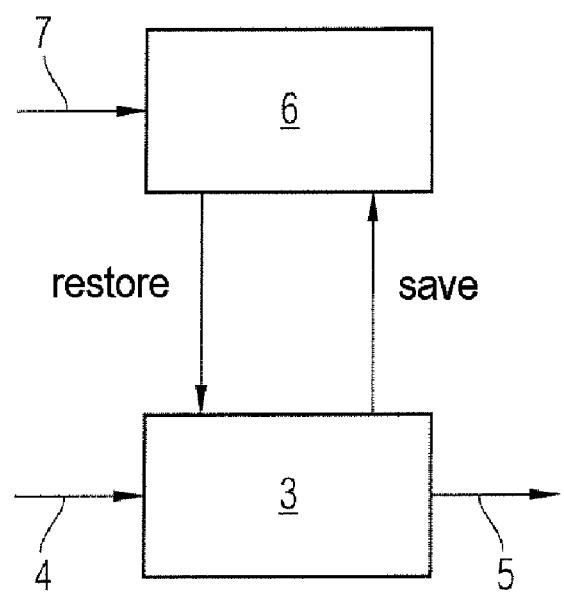
FIG. 3 shows a retention memory cell (prior art)

FIG. 3 illustrates a retention memory cell from the prior art, for example a retention flip-flop from the document U.S. Pat. No. 5,473,571. Said memory cell comprises a memory element 3, for example, a flip-flop serving for storing an item of digital information during customary operation of the circuit block comprising the retention memory cell. The memory element typically comprises a data input 4 and a data output 5, it also being possible for the data input 4 and the data output 5 to coincide. Furthermore, a retention element 6 is provided, in which the data information stored in the memory element 3 can be saved before the circuit block and thus also the memory element 3 are put into the power-down mode. The digital data information is retained in the retention element 6 during the power-down mode. For this purpose, the retention element 6 is realized in a non-volatile memory technology. As an alternative, the retention element 6 may be implemented as a volatile memory means, in which case the current or voltage supply of the memory element 3 and of the retention element 6 are to be separated. If the circuit block and thus also the memory element 3 are subsequently activated again, the saved data information can be restored from the retention element 6 into the memory element 3 again. A digital control signal 7 serves for controlling the saving into the retention element and the restoring from the retention element.

Figure 4:
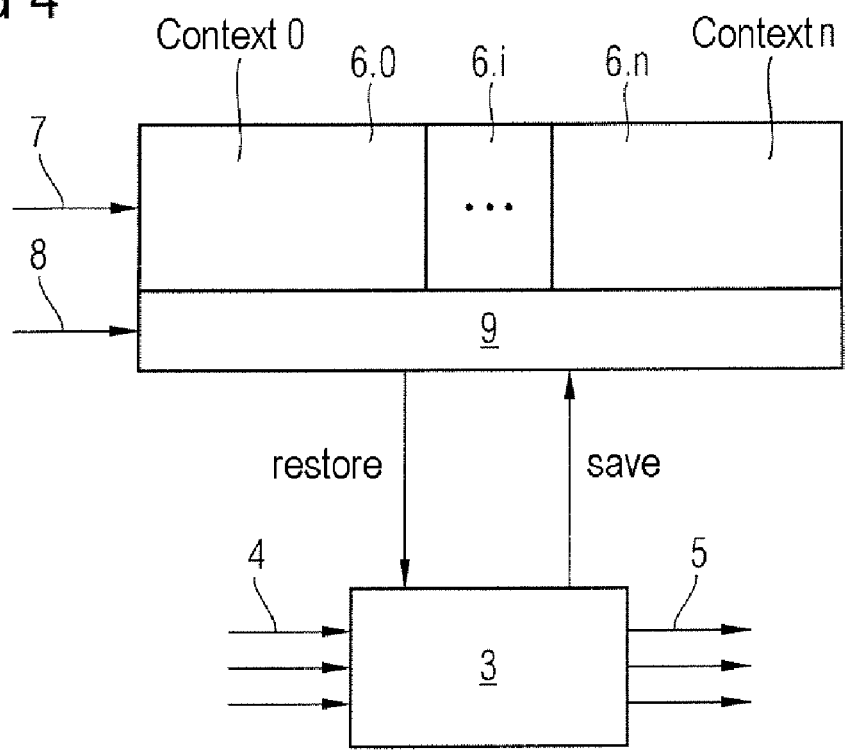
FIG. 4 shows an exemplary embodiment of a multi-context memory cell according to one embodiment of the invention.

FIG. 4 illustrates an exemplary multi-context memory cell according to one embodiment of the invention based on the retention memory cell from the prior art as illustrated in FIG. 3. Circuit parts and signals provided with identical reference symbols in FIG. 3 and FIG. 4 correspond to one another. One difference between FIG. 3 and FIG. 4 may be that the multi-context memory cell according to the embodiment of the invention in FIG. 4 comprises a plurality of retention elements $6.i$, each retention element $6.i$ being assigned to a specific context i from a total of n+1 contexts. Each context i can be read into the memory element 3 selectively via the context selection element 9. Moreover, the storage content of the memory element 3 can be saved selectively into one of the n+1 retention elements $6.i$ via the context selection element 9. The data transfer between the memory element 3 and the retention elements $6.i$ is controlled by means of the digital control signal 7 (saving/restoring) and also by means of a digital selection signal 8, a specific retention element $6.i$ being selected depending on the selection signal 8 on the part of the context selection element 9. In one embodiment, the two signals 7 and 8 may not be present in separate form, but rather may also be embodied as a combined signal (in this respect, cf. FIG. 8, for example).

The exemplary embodiment of the multi-context memory cell as illustrated in FIG. 4 may be characterized by allowing the retention elements $6.i$ to perform two functions: firstly, they may serve as buffer memories during power-down operation as in FIG. 3; secondly, they may be used as memories for the individual contexts.

If the memory element 3—as indicated in FIG. 4—has additional inputs and/or outputs, it may not be necessary, in contrast to other circuit concepts for multi-context processing, for the retention elements 6.*i* also to have said inputs and/or outputs, since the data connection between the multi-context memory cell and the surroundings may, in some cases, be maintained only via the memory element 3.

Figure 5:
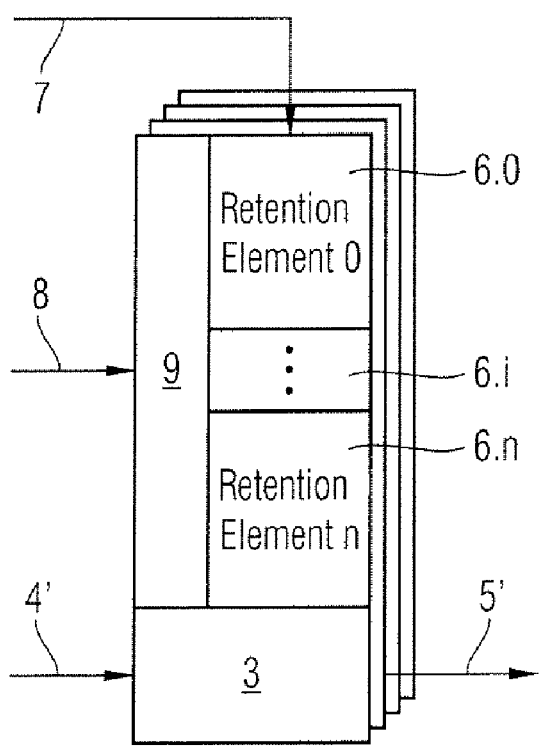
FIG. 5 shows an exemplary embodiment of a multibit multi-context memory cell according to one embodiment of the invention.

A multibit multi-context memory cell according to one embodiment of the invention can be realized by quasi-parallel arrangement of N+1 (where N>0) multi-context memory cells in accordance with FIG. 4. A multibit multi-context memory cell of this type comprises N+1 binary memory elements 3 for storing an N+1 bit information item. These form a multibit memory element. N+1 retention elements from different binary multi-context memory cells respectively form one of a total of n+1 multibit retention elements, it being possible for the N+1 data bits of the multibit memory element to be saved in each multibit retention element. FIG. 5 shows an exemplary embodiment of a multibit multi-context memory cell for N=3, which has a 4 bit wide data input 4' and a 4 bit wide data output 5'. Circuit parts and signals provided with identical reference symbols in FIG. 4 and FIG. 5 correspond to one another.

Figure 6:
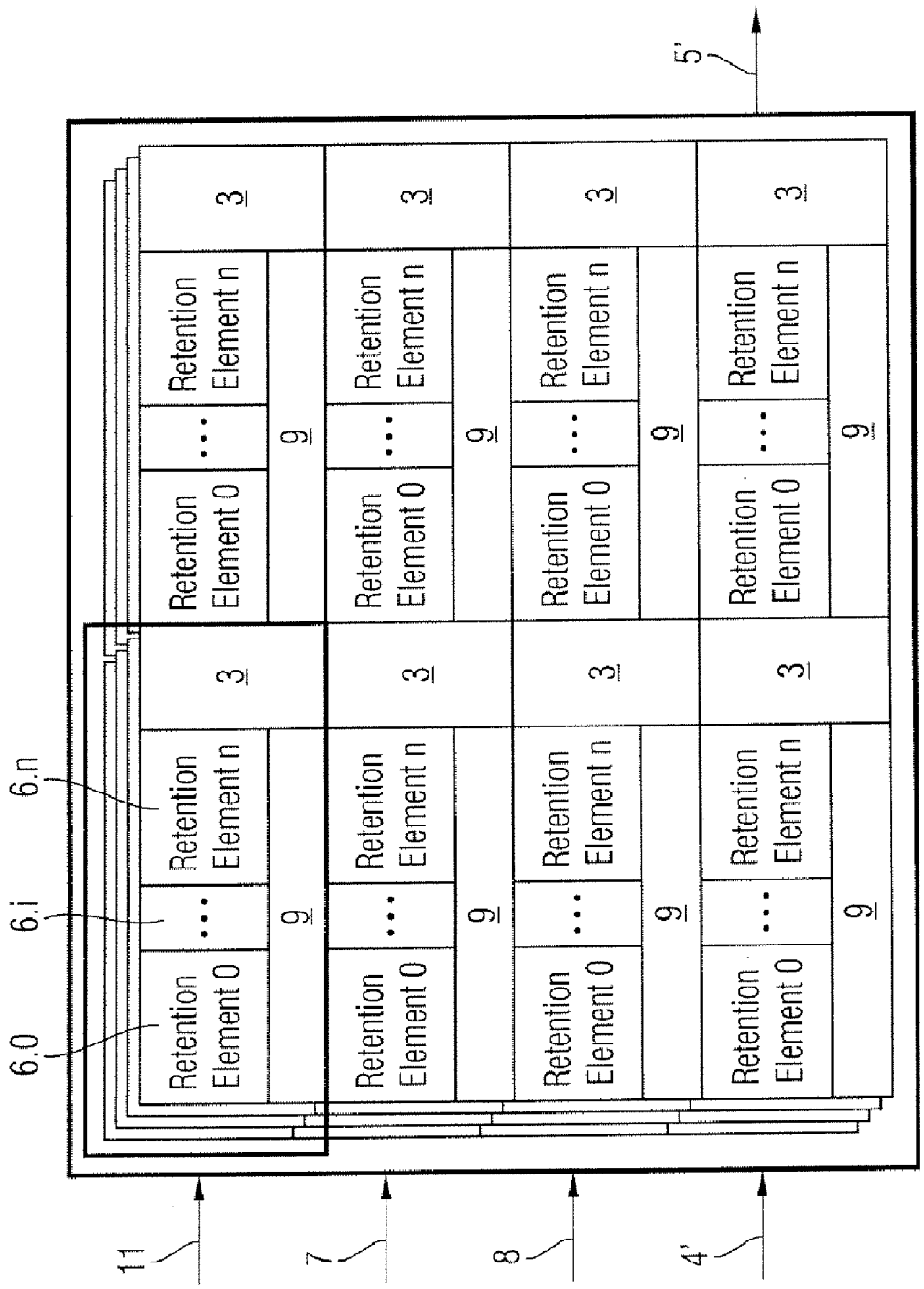
FIG. 6 shows a memory block comprising a plurality of multibit multi-context memory cells according to one embodiment of the invention.

A plurality of multibit multi-context memory cells according to one embodiment of the invention can be combined to form a memory block. An exemplary embodiment of such a memory block is illustrated in FIG. 6. Circuit parts and signals provided with identical reference symbols in FIG. 5 and FIG. 6 correspond to one another in this case. The width of the data input 4' and of the data output 5' of the memory block is in this case identical to the width of the data input 4' and of the data output 5' of a multibit multi-context memory cell. A specific multibit multi-context memory cell can be selected via an address input. The selected multibit multi-context memory cell is then connected to the data input 4' and the data output 5'.

The retention elements 6.*i* in FIGS. 4 to 6 may be implemented purely in a CMOS technology or using a non-volatile memory technology.

Figure 7:
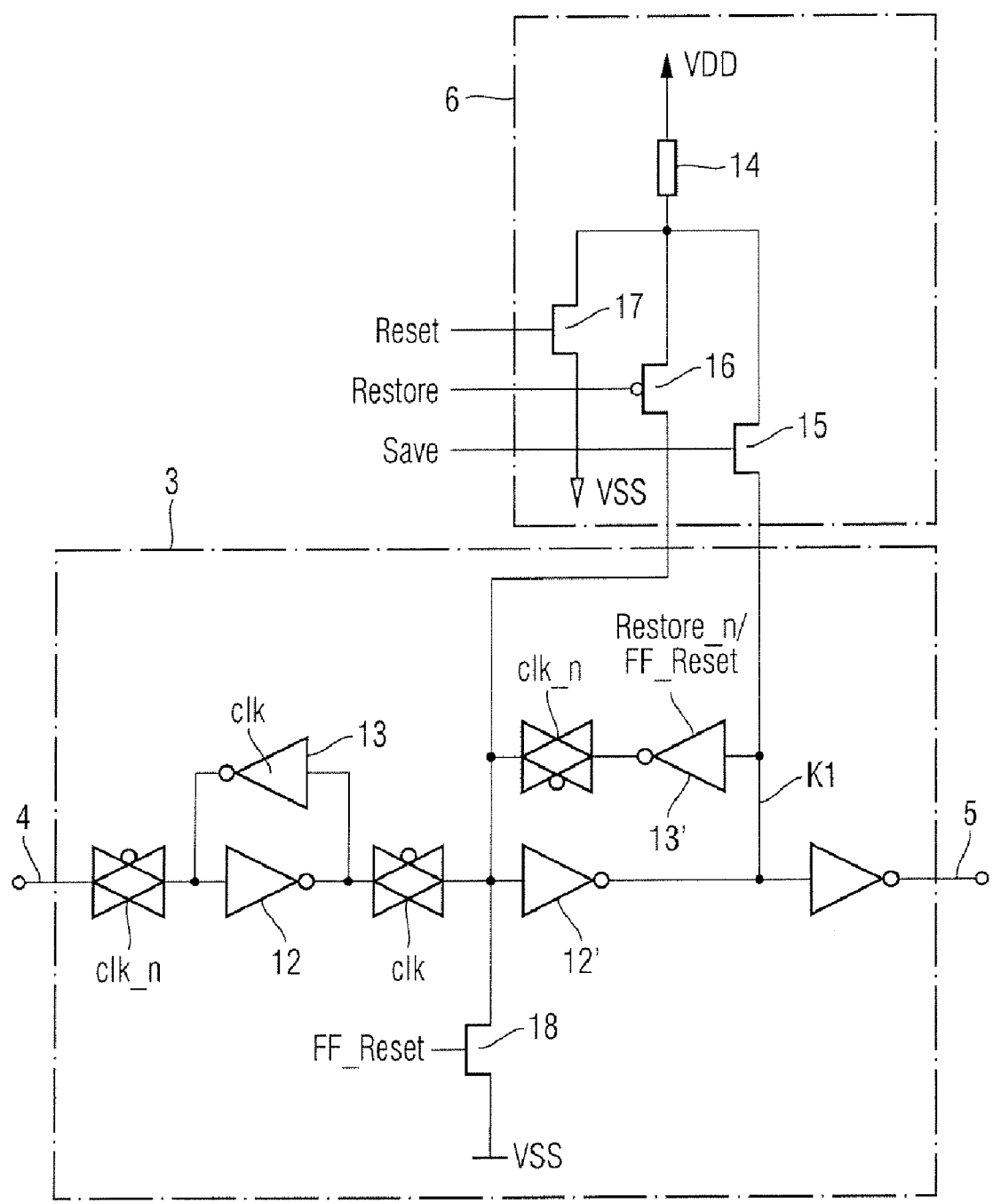
FIG. 7 shows a retention memory cell based on PCM technology according to one embodiment of the invention.

In one embodiment, the retention elements 6.*i* may be implemented using a PCM technology. The functioning of the PCM technology is explained below with reference to FIG. 7, which illustrates a retention memory cell based on PCM technology in the sense of FIG. 3. The specific embodiment of the retention memory cell illustrated in FIG. 7 is not regarded as belonging to the prior art in this case. Signals and circuit parts provided with identical reference symbols in FIGS. 3 and 7 correspond to one another. In the case of the retention memory cell illustrated in FIG. 7, the memory element 3 is realized as a master-slave D-type flip-flop, both the master stage and the slave stage in each case being implemented as a bistable multivibrator in the form of two feedback CMOS inverters 12 and 13, and respectively 12' and 13'. A simple latch with only one multivibrator would also be conceivable instead of a master-slave D-type flip-flop. As long as the binary signals FF_Reset, Restore and Save are at low, high and low, respectively, that is to say are inactive, the retention memory cell operates like a customary master-slave D-type flip-flop. Furthermore, a PCM resistance element 14 is provided for non-volatile saving of the storage state of the flip-flop 3 in the retention element 6, said resistance element being connected to the positive operating voltage potential VDD at the first terminal. At the second terminal, the PCM resistance element 14 can be connected to the storage node K1 via the N-MOS transistor 15 for the purpose of saving the data information of the flip-flop. Furthermore, the PCM resistance element 14 can be connected to the storage node K2 of the flip-flop 3 by means of the P-MOS transistor 16 for the purpose of restoring the saved information into the flip-flop 3. Furthermore, the N-MOS transistor 17 is provided for the purpose of initializing the PCM resistance element 14.

The choice of the respective type of transistor, that is to say whether an N-MOS transistor or a P-MOS transistor is used, depends on whether the ground potential VSS or the operating voltage potential VDD is switched via the transistor. It holds true, in principle, that N-MOS transistors can switch the ground potential without any losses, that is to say without a voltage drop, while P-MOS transistors can switch the operating voltage potential VDD without any losses. It would be conceivable, of course, to choose the transistor types in a manner deviating from FIG. 7, in which case the polarity of the drive signals would have to be adapted; the interference immunity of the circuit would be impaired in this case, however. Moreover, MOS transmission gates each having a P-MOS transistor and an N-MOS transistor could also be used instead of individual MOS transistors. It should be pointed out that, as an alternative, the PCM resistance element 14 could also be connected to the ground potential VSS instead of to the positive operating voltage potential VDD, in which case ideally the transistor 15 is a P-MOS transistor, the transistor 16 is an N-MOS transistor and the transistor 17 is a P-MOS transistor. Modifications described above are conceivable in the same way for the circuits described below.

Figure 1:
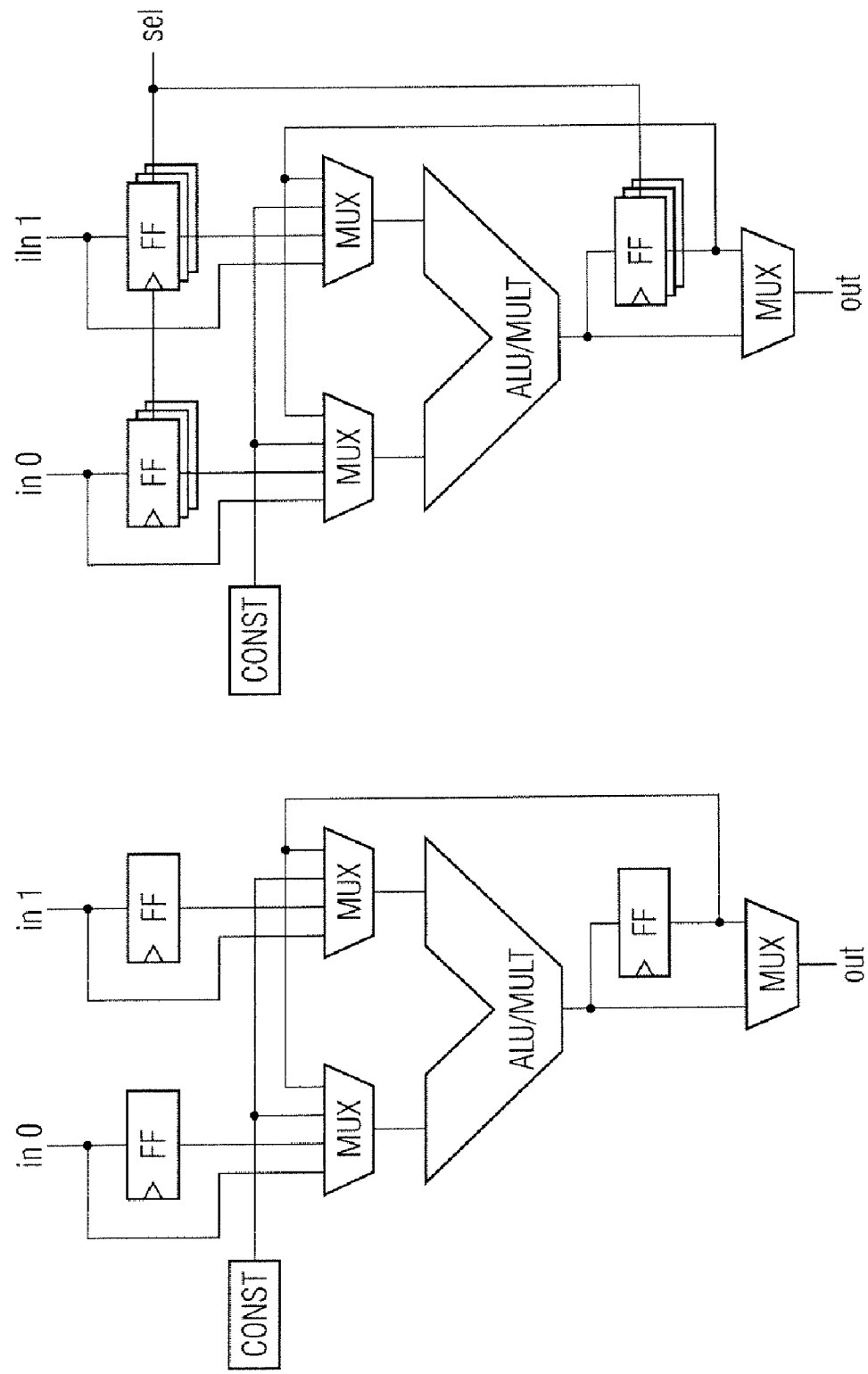
FIG. 1 shows two processor data paths without (on the left) and with (on the right) multi-context support (prior art)
Figure 2:
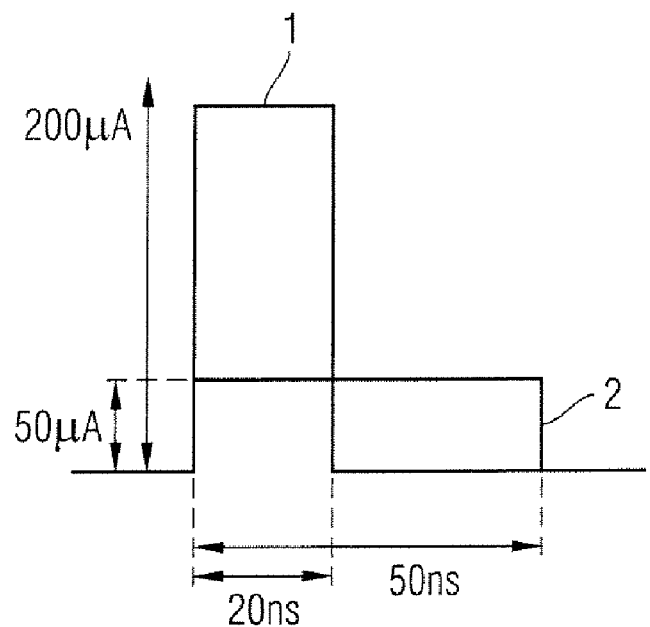
FIG. 2 shows two idealized current pulses for the programming of PCM resistance elements (prior art)

Before the storage content of the flip-flop 3 can be stored in the PCM resistance element 14, the PCM resistance element 14 may be initialized. This is done by the signal Reset being switched to high, so that the N-MOS transistor 17 may utilize low resistance and a suitable current pulse flows through the PCM resistance element 14. In this case, the current pulse may be set such that the PCM resistance element uses high resistance (cf. curve 1 in FIG. 2). The saving of the binary data information of the flip-flop 3 is initiated by activation of the signal Save, that is to say that the signal Save switches from low to high, so that the transistor 15 is turned on. In this case, the potential of the storage node K1 in the slave stage determines whether or not a current flows through the PCM resistance element 14 when the transistor 15 is in the on state. If the potential of the storage node K1 is close to the ground potential VSS, a current flows through the PCM resistance element 14, which current is dimensioned in such a way that the PCM resistance element 14 is switched in low-resistance fashion (cf. curve 2 in FIG. 2). If the potential of the storage node K1 is close to the positive operating voltage potential VDD, no appreciable current flow takes place through the PCM resistance element 14, so that the PCM resistance element 14 remains in its high-resistance state.

The storage state of the flip-flop 3 is thus saved in a non-volatile manner in the PCM resistance element 14. The supply voltage of the memory cell can then be switched off without loss of information.

For restoring the saved information, the slave stage is firstly reset by virtue of the signal FF_Reset being changed over from low to high. In this case, a conductive connection between the storage node K2 and the ground terminal VSS is produced via the N-MOS transistor 18 in the on state, so that the potential of the storage node K2 is forced to VSS. The signal Restore is then activated, that is to say that the signal Restore switches from high to low. This may have the effect that the P-MOS transistor 16 is turned on and the storage node K2 is thus conductively connected to the PCM resistance element 14, while the transistor 18 is switched in high-resistance fashion again. In addition, the inverter 13' is deactivated (either by the signal FF_Reset or the inverted signal Restore_n with respect to the signal Restore switching from low to high), thereby interrupting the feedback in the slave stage. This prevents the output of the inverter 13' from influencing the read-out of the PCM resistance element.

As long as the signal Restore is active, the storage node K2 is subjected to charge reversal depending on the resistance value of the PCM resistance element 14. The pulse duration of the signal Restore is chosen in such a way that when the time duration has elapsed, the potential of the storage node K2 approximately corresponds to VDD if the resistance element 14 has low resistance, or the potential of the storage node K2 has approximately remained at VSS if the resistance element 14 has high resistance. The behavior of the storage node K1 is exactly opposite to that of the storage node K2 on account of the inverter 12'. The multivibrator then toggles according to the potentials at the storage nodes K2 and K1.

After the restoring process, the retention memory cell can be operated as a customary master-slave D-type flip-flop again.

Figure 8:
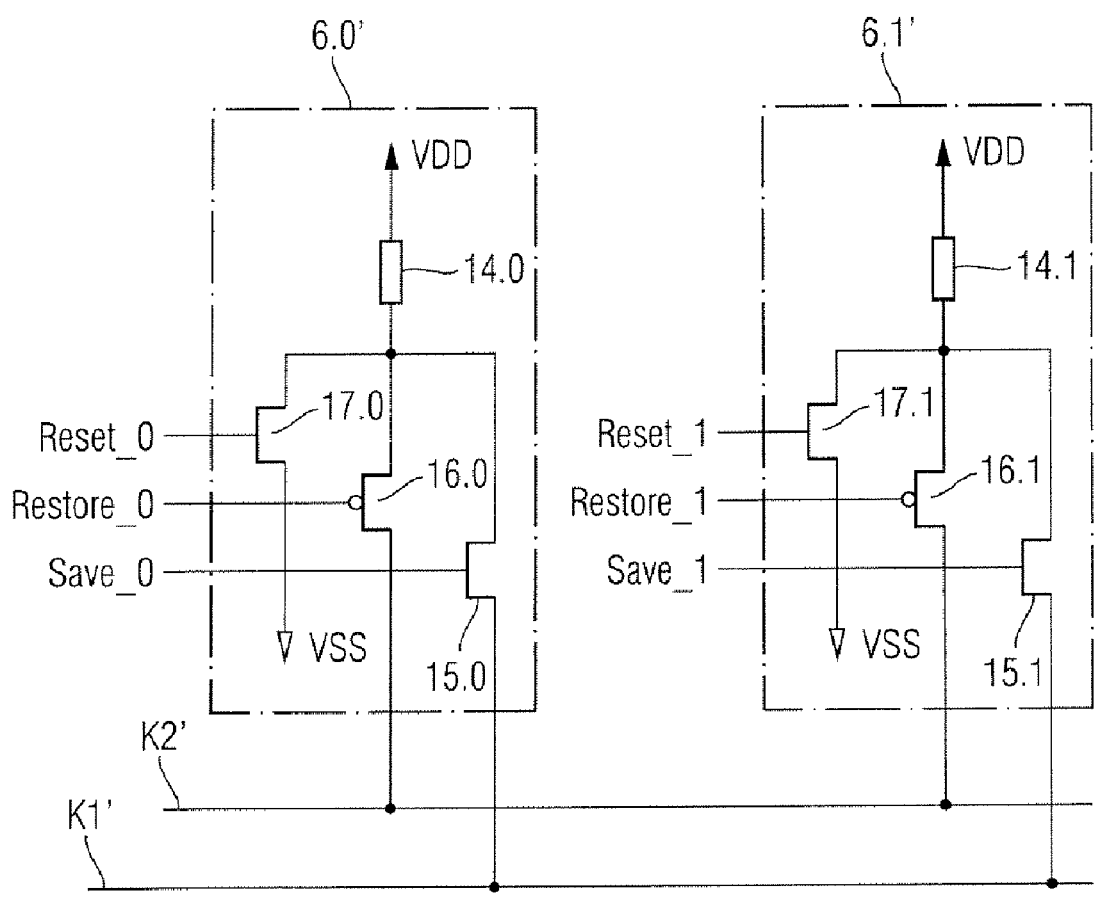
FIG. 8 shows an exemplary embodiment of a multi-context memory cell according to one embodiment of the invention.

FIG. 8 illustrates an exemplary embodiment of the multi-context memory cell as an extension of the circuit illustrated in FIG. 7, in which case the flip-flop 3 in FIG. 7 is to be supplemented in FIG. 8 in such a way that the nodes K1 and K1' and also the nodes K2 and K2' coincide. As an alternative, a different memory element could also be used, for example a simple latch. In the case of the multi-context memory cell in accordance with FIG. 8, the retention element 6 from FIG. 7 and also its control signals Reset, Restore and Save are replicated according to the number n+1 (where n>0) of the contexts to be supported. One retention element 6.$i$' is provided per context, said retention element operating in the same way as the retention element 6 in FIG. 8. For simplification, only the first two retention elements 6.0' and 6.1' and their control signals Reset_i, Restore_i and Save_i are illustrated in FIG. 8.

The present context may be stored in the flip-flop 3 during normal operation of the multi-context memory cell. For a context switch, firstly the present context may be saved from the flip-flop 3 into a PCM resistance element 14.$i$ of a selected retention element 6.$i$'. The saving of the storage content of the flip-flop 3 is effected in the same way as already described in connection with FIG. 7, that is to say that firstly the resistance element 14.$i$ of the selected retention element 6.$i$' is initialized and then the actual saving of the data information into the respective resistance element 14.$i$ is effected. The selection of a specific retention element 6.$j$' may be provided by, for example, having the control signals Reset_j (for initializing the respective resistance element 14.$i$) and Save_j (for the actual saving) of a specific retention element 6.$i$' activated in the manner described in connection with FIG. 7, that is to say switch from low to high, while the remaining control signals Reset_i and Save_i of the remaining retention elements 6.$i$' remain deactivated. The context selection element 9 illustrated in FIG. 4 may thus be provided in the various retention elements 6.$i$'.

As an alternative, instead of being saved only in the course of a context switch, the context of the flip-flop 3 may be saved in a retention element 6.$i$' when the data content of the flip-flop 3 changes.

After the saving process, a context of a specific retention element 6.$k$' may be loaded into the flip-flop 3 in the same way as in FIG. 7. For this purpose, the signal Restore_k of the respective retention element 6.$k$' is activated in the manner described in connection with FIG. 7, that is to say that this signal switches from high to low. In addition, the data transfer into the flip-flop 3 may be prepared—as explained in connection with FIG. 7—by means of the signals FF_Reset and optionally Restore_n.

Instead—as described above—of initializing the respectively selected PCM resistance element 14.$i$ shortly before the actual process of saving the data information stored in the flip-flop 3, as an alternative a resistance element 14.$i$ could be initialized when a retention element 6.$i$' is read. In this case, the initialization may be carried out during normal operation, thereby avoiding a delay as a result of the initialization. The procedure of initializing the respective PCM resistance element 14.$i$ only shortly before the actual saving operation affords the advantage, by contrast, that the context information may be retained in the retention element 6.$i$', so that, under certain circumstances, it may not be necessary to save the data information of the memory element 3 if the data information has remained unchanged in the memory element 3.

The node K2' may alternatively also be connected to the output of the inverter 13 in the master stage instead of to the node K2 in the slave stage. This may provide for saving of the data content of the flip-flop 3 and the read-out of a retention element 6.$j$' may be effected simultaneously.

Figure 9:
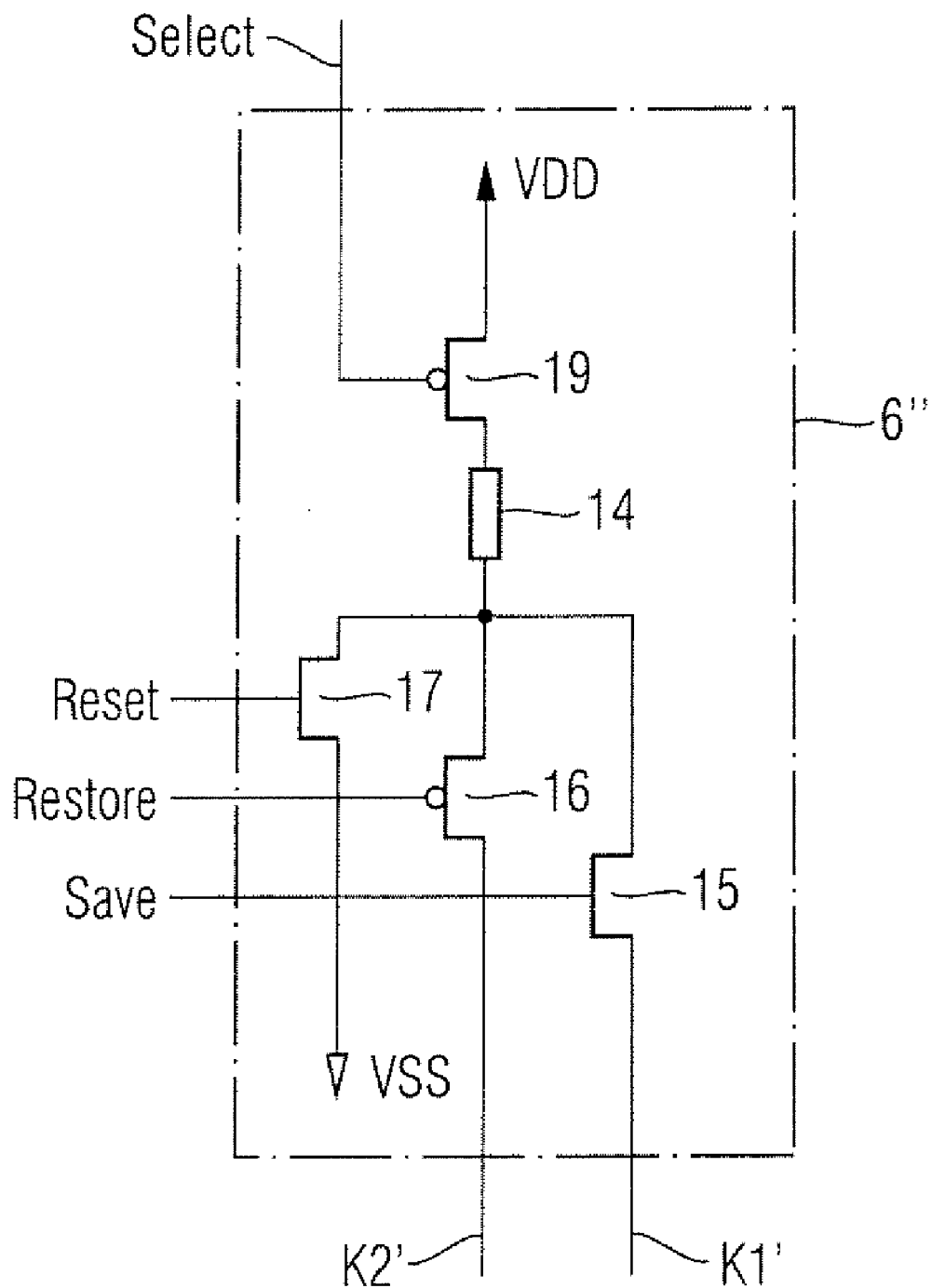
FIG. 9 shows a retention element with selection switches according to one embodiment of the invention.

FIG. 9 illustrates a retention element 6" that is modified in comparison with FIGS. 7 and 8. In the case of this modified retention element 6", a selection switch 19, here in the form of a P-MOS transistor controlled by the binary control signal Select, is situated in series with the PCM resistance element 14. The use of a selection switch 19 per retention element may enable the driving of the multi-context memory cell to be simplified. Moreover, the circuitry outlay may be reduced.

Figure 10:
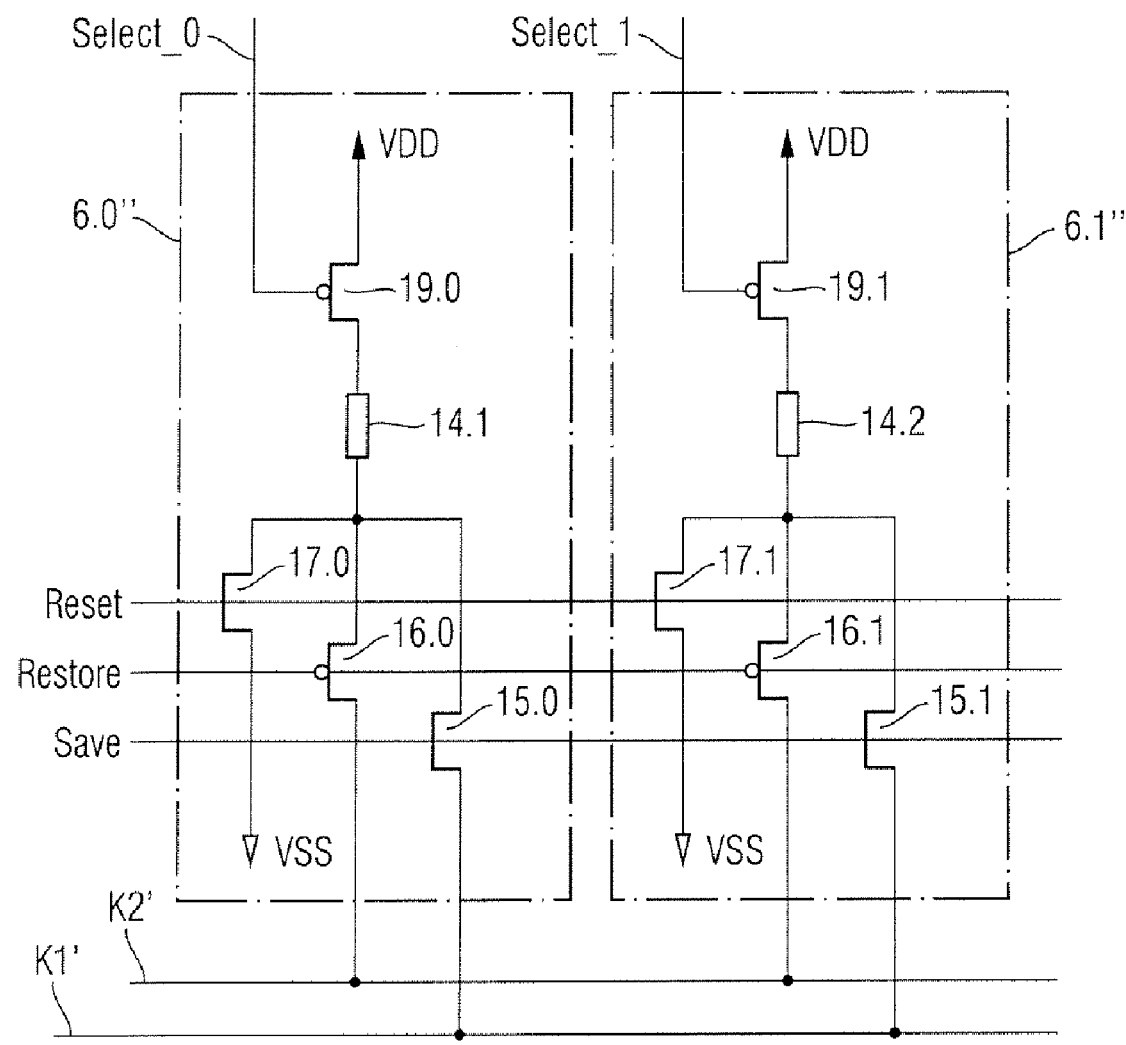
FIG. 10 shows an exemplary embodiment of a multi-context memory cell using selection switches according to one embodiment of the invention.

FIG. 10 shows an exemplary embodiment of the multi-context memory cell using a selection switch 19.$i$ per retention element 6.$i$''', in which case the flip-flop 3 from FIG. 7 or an alternative memory element may be supplemented in FIG. 10 as described in connection with FIG. 8. Circuit parts and signals provided with identical reference symbols in FIGS. 8 and 10 correspond to one another. One advantage of the multi-context memory cell illustrated in FIG. 10 may be that, one set of the control signals Reset, Restore and Save for controlling the transistors 17.$i$, 16.$i$ and 15.$i$, respectively, may be used, which may be received by each of the retention element 6.$i$''. The selection of a specific retention element 6.$j$'' for saving or restoring an item of data information may be effected by means of the select signals Select_i, the select signal Select_j of the selected retention element 6.$j$'' being active (that is to say being at low), while the select signals Select_i of the remaining retention elements 6.$i$'' may not be active (that is to say are at high). The selection transistors 19.$i$, j driven by means of the select signals Select_i, j thus correspond to the selection element 9 illustrated in FIG. 4.

Figure 11:
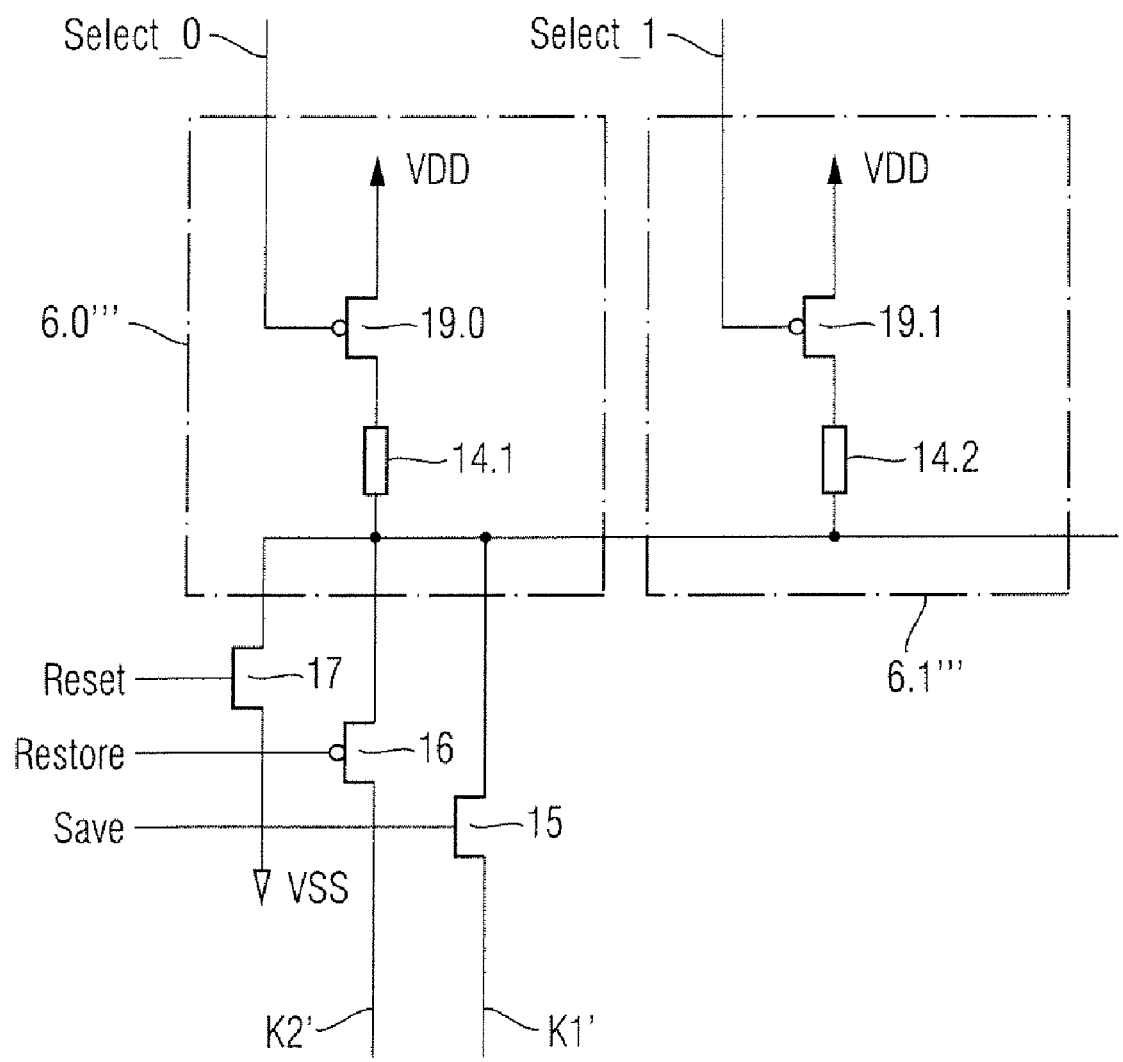
FIG. 11 shows an alternative exemplary embodiment to FIG. 10 of a multi-context memory cell using selection switches according to one embodiment of the invention.

FIG. 11 shows an alternative embodiment to FIG. 10 of the multi-context memory cell according to one embodiment of the invention, in which case the flip-flop 3 from FIG. 7 or an alternative memory element is to be supplemented in FIG. 11 as described in connection with FIG. 8. In this embodiment, a single set of the control signals Reset, Restore and Save may used for each of the retention elements 6.$i$''' as in FIG. 10, and instead of a dedicated set of transistors 17.$i$, 16.$i$, 15.$i$ per retention element 6.$i$''', a single set of said transistors 17, 16 and 15 may be used for each of the retention elements 6.$i$'''.

In one embodiment, the depicted multi-context memory cell may have a significantly reduced circuitry outlay since only a single resistance element 14.*i* and a single selection transistor 19.*i* may be provided—besides the three common control transistors 15, 16 and 17—per retention element 6.*i*'''.

While the foregoing is directed to embodiments of the present invention, other and further embodiments of the invention may be devised without departing from the basic scope thereof, and the scope thereof is determined by the claims that follow.

What is claimed is:

1. A multi-context memory cell, comprising:
a first memory cell for storing an item of digital data information, wherein the digital data information is a bit of binary data information;
a plurality of second memory cells each configured to store the item of digital data information stored in the first memory cell, wherein each of the plurality of second memory cells comprises a resistance element having a nonvolatile binary programmable resistance value;
storage circuitry configured to save the digital data information stored in the first memory cell into a selected one of the second memory cells;
load circuitry configured to load an item of digital data information from a selected one of the second memory cells into the first memory cell; and
a plurality of selection switches are each connected in series with the resistance element in a corresponding one of the plurality of memory cells.

2. A multi-context memory cell, comprising:
a first memory cell for storing an item of digital data information, wherein the digital data information is a bit of binary data information;
a plurality of second memory cells each configured to store the item of digital data information stored in the first memory cell, wherein each of the plurality of second memory cells comprises a resistance element having a nonvolatile binary programmable resistance value;
storage circuitry configured to save the digital data information stored in the first memory cell into a selected one of the second memory cells; and
load circuitry configured to load an item of digital data information from a selected one of the second memory cells into the first memory cell,
wherein the first memory cell comprises one or more storage nodes, wherein the binary data information is stored in the form of a potential value of a first storage node of the one or more storage nodes.

3. The multi-context memory cell of claim 2, wherein each of the plurality of second memory cells comprises:
a saving switch configured to connect the first storage node of the one or more storage nodes to the resistance element.

4. The multi-context memory cell of claim 3, wherein the saving switch comprises a MOS transistor.

5. The multi-context memory cell of claim 3, wherein each of the saving switches are controlled by means of a first binary control signal.

6. The multi-context memory cell of claim 2, wherein the load circuitry is configured to provide a load signal corresponding to the resistance value of a selected resistance element to a second storage node of the one or more storage nodes of the first memory cell.

7. The multi-context memory cell of claim 6, wherein the first memory cell constitutes a master-slave D-type flip-flop comprising:

a master stage, comprising a first bistable multivibrator; and
a slave stage, comprising a second bistable multivibrator, wherein the first storage node is part of the second bistable multivibrator and the second storage node is part of the first bistable multivibrator.

8. The multi-context memory cell of claim 6, wherein load circuitry comprises:
a plurality of load switches each arranged between the respective resistance element of the plurality of second memory cells and the second storage node of the one or more storage nodes of the first memory cell.

9. The multi-context memory cell of claim 8, wherein the each of the plurality of load switches comprises a MOS transistor.

10. A multi-context memory cell comprising:
a first memory cell for storing an item of digital data information, wherein the digital data information is a bit of binary data information;
a plurality of second memory cells each configured to store the item of digital data information stored in the first memory cell, wherein each of the plurality of second memory cells comprises a resistance element having a nonvolatile binary programmable resistance value;
storage circuitry configured to save the digital data information stored in the first memory cell into a selected one of the second memory cells; and
load circuitry configured to load an item of digital data information from a selected one of the second memory cells into the first memory cell,
wherein the storage circuitry comprises:
a plurality of initialization switches each connected between a respective resistance element for each of the plurality of second memory cells and a node having a fixed potential, wherein the switch, when in a conducting state, is configured to initialize the resistance value for the corresponding second memory cell to a specific value of the nonvolatile binary programmable resistance.

11. A multi-context memory cell, comprising:
a first memory cell for storing an item of digital data information, wherein the digital data information is a bit of binary data information;
a plurality of second memory cells each configured to store the item of digital data information stored in the first memory cell, wherein each of the plurality of second memory cells comprises a resistance element having a nonvolatile binary programmable resistance value, wherein each of the resistance elements is configured to be placed in one of an amorphous state and a polycrystalline state, wherein each of the resistance elements exhibits a first resistance value in the amorphous state and a second resistance value in the polycrystalline state, and wherein the first resistance value is greater than the second resistance value;
storage circuitry configured to save the digital data information stored in the first memory cell into a selected one of the second memory cells; and
load circuitry configured to load an item of digital data information from a selected one of the second memory cells into the first memory cell.

12. The multi-context memory cell of claim 1, wherein the storage circuitry comprises an initialization switch which is arranged between each of the resistance elements of the plurality of second memory cells and a node having a fixed potential, wherein the initialization switch, when in a conducting state, is configured to initialize the resistance value of each of the corresponding plurality of second memory cells to a specific value of the nonvolatile binary programmable resistance.

13. A multi-context memory cell, comprising:
- a first memory cell for storing an item of digital data information;
- a plurality of second memory cells each configured to store the item of digital data information stored in the first memory cell;
- storage circuitry configured to save the digital data information stored in the first memory cell into a selected one of the second memory cells;
- load circuitry configured to load an item of digital data information from a selected one of the second memory cells into the first memory cell; and
- circuitry configured to save the digital data information stored in the first memory cell in a selected one of the plurality of second memory cells and load an item of digital data information from another selected second one of the plurality of second memory cells into the first memory cell.

14. The multi-context memory cell of claim 1, wherein the first memory cell comprises at least one bistable multivibrator comprising two cross-coupled inverters.

\* \* \* \* \*